(12) United States Patent
Omote et al.

(10) Patent No.: US 9,128,578 B2
(45) Date of Patent: Sep. 8, 2015

(54) CAPACITIVE TYPE TOUCH SENSOR WITH OPTICAL FUNCTIONALITY

(71) Applicant: NISSHA PRINTING CO., LTD., Kyoto (JP)

(72) Inventors: Ryomei Omote, Kyoto (JP); Kazuhiro Nishikawa, Kyoto (JP); Takao Hashimoto, Kyoto (JP)

(73) Assignee: NISSHA PRINTING CO., LTD., Kyoto (JP)

( * ) Notice: Subject to any disclaimer, the term of this patent is extended or adjusted under 35 U.S.C. 154(b) by 0 days.

(21) Appl. No.: 14/369,168

(22) PCT Filed: Dec. 18, 2012

(86) PCT No.: PCT/JP2012/082735
§ 371 (c)(1),
(2) Date: Jun. 26, 2014

(87) PCT Pub. No.: WO2013/099691
PCT Pub. Date: Jul. 4, 2013

(65) Prior Publication Data
US 2014/0354304 A1    Dec. 4, 2014

(30) Foreign Application Priority Data

Dec. 28, 2011  (JP) ................................. 2011-289808
Mar. 31, 2012  (JP) ................................. 2012-083376

(51) Int. Cl.
*G01R 27/26* (2006.01)
*G06F 3/044* (2006.01)
(Continued)

(52) U.S. Cl.
CPC .............. *G06F 3/044* (2013.01); *G02B 5/3083* (2013.01); *G02F 1/13338* (2013.01); *G06F 3/041* (2013.01); *H01L 27/323* (2013.01)

(58) Field of Classification Search
CPC ...................................................... H01L 27/323
USPC ................................................... 324/658–690
See application file for complete search history.

(56) References Cited

U.S. PATENT DOCUMENTS 7,679,609 B2 *   3/2010  Matsumoto et al. ........... 345/173
2008/0176042 A1 *   7/2008  Nashiki et al. ................. 428/172
(Continued)

FOREIGN PATENT DOCUMENTS

JP    H03-174512 A    7/1991
JP    2010-162746 A   7/2010
(Continued)

OTHER PUBLICATIONS

International Search Report in PCT/JP2012/082735 dated Feb. 5, 2013.

*Primary Examiner* — Huy Q Phan
*Assistant Examiner* — Dustin Dickinson
(74) *Attorney, Agent, or Firm* — Global IP Counselors, LLP

(57) ABSTRACT

A capacitive type touch sensor has optical functionality, low reflection and thin thickness as well as narrow frames. The capacitive type touch sensor includes a cover glass, and a capacitive type film sensor member adhered to a rear surface of the cover glass. The capacitive type touch sensor further includes a polarization plate between the cover glass and the film sensor member. The film sensor member includes a transparent base sheet having a λ/4 phase difference film, transparent conductive films so as to form electrode pattern s on the central windows and fine line routed circuit pattern on the peripheral frames on both sides of the base sheet, and light-blocking conductive films laminated on the fine line routed circuit patterns of the transparent conductive film.

5 Claims, 9 Drawing Sheets

(51) Int. Cl.
*G06F 3/041* (2006.01)
*G02B 5/30* (2006.01)
*G02F 1/1333* (2006.01)
*H01L 27/32* (2006.01)

(56) References Cited

U.S. PATENT DOCUMENTS

| | | | |
|---|---|---|---|
| 2008/0266273 A1 | 10/2008 | Slobodin et al. | |
| 2009/0050454 A1* | 2/2009 | Matsukawa et al. | 200/313 |
| 2009/0295752 A1* | 12/2009 | Liu et al. | 345/174 |
| 2011/0169767 A1* | 7/2011 | Weindorf et al. | 345/174 |
| 2011/0285640 A1* | 11/2011 | Park et al. | 345/173 |
| 2012/0073947 A1* | 3/2012 | Sakata et al. | 200/600 |
| 2012/0223905 A1 | 9/2012 | Jeon et al. | |

FOREIGN PATENT DOCUMENTS

| | | |
|---|---|---|
| JP | 2010-238052 A | 10/2010 |
| JP | 2011-081810 A | 4/2011 |
| JP | 2011-253546 A | 12/2011 |
| WO | 2011-105221 A1 | 9/2011 |
| WO | 2011108881 A2 | 9/2011 |
| WO | 2011159028 A2 | 12/2011 |

\* cited by examiner

CAPACITIVE TYPE TOUCH SENSOR WITH OPTICAL FUNCTIONALITY

CROSS-REFERENCE TO RELATED APPLICATIONS

This U.S. National stage application claims priority under 35 U.S.C. §119(a) to Japanese Patent Application No. 2011-289808, filed in Japan on Dec. 28, 2011, and to Japanese Patent Application No. 2012-083376, filed in Japan on Mar. 31, 2012, the entire contents of Japanese Patent Application Nos. 2011-289808 and 2012-083376 are hereby incorporated herein by reference.

BACKGROUND

1. Field of the Invention

The present invention relates to a capacitive type touch sensor in which a film sensor member is adhered to a rear surface of a cover glass which is attached to an LCD part of the electronic apparatus, particularly to one having optical functionality such as circularly polarized light and giving the phase difference.

2. Background Information

Conventionally, the capacitive type touch sensor, in which a film sensor member is attached to a rear surface of a cover glass of the display window of the electric device, is arranged on an upper surface of display such as LCD (Liquid Crystal monitor) and OLED (Organic Light Emitting Diode). In this arrangement, since daylight is reflected at an interface between the air layer and the film sensor member, as well as an interface between the air layer and the display, the contrast on the display is lowered, which is a problem.

It is possible to restrain the reflection to 50% by adding a polarization plate between the cover glass and the film sensor member. In this case, even when the touch sensor, to which the polarization plate is added, is arranged on the LCD, if the absorption axis of the polarization plate is matched with that of the LCD, it is possible to prevent the brightness of the LCD from being lowered.

In addition, if the touch sensor is designed such that a polarization plate and a λ/4 phase difference film are added between the cover glass and the film sensor member in this order from the cover glass side, i.e., a circularly polarized light filter is added, it is possible to further restrain the reflection compared to a case of adding only the polarization plate.

However, in the capacitive touch sensor with circularly polarized light function in which the circularly polarized light filter consisting of the polarization plate and the λ/4 phase difference film is added, thickness of the circularly polarized light filter is added, causing the thickness of a product into which the touch sensor is assembled increases, which is a new problem. Therefore, one type of capacitive type touch sensor is proposed as shown in paragraph 0071 of Patent Citation 1, recently. The capacitive type touch sensor includes a film sensor member of a structure employing a two layer system, a polarization plate, and a cover glass. The film sensor member includes a first conductive film and a second conductive film. The first conductive film has an upper surface on which a first conductive layer such as ITO is provided. The second conductive film is adhered onto the first conductive layer and has an upper surface on which a second conductive layer such as ITO is provided. The polarization plate and the cover glass are adhered to the upper surface of the film sensor member. A λ/4 phase difference film is employed as a base member of the second conductive film. According to the touch sensor described in Japanese Patent Publication 2011-81810, since the λ/4 phase difference film is employed as a base member for the conductive layer of the film sensor member, and not as a separate member provided on the film sensor member, it is possible to provide a thin capacitive touch sensor with circularly polarized light function.

In addition, conventionally, when observing the LCD through the polarized sunglass, coloring and decrease in transmission factor occur depending on the polarization plate angle on the LCD side. In order to overcome the problem, it has been proposed for a long time and is described in Japanese Patent Publication H03-174512 that a λ/4 phase difference film is arranged between the polarized sunglass and the LCD, for example.

In the capacitive type touch sensor market, it has been required to further narrow the frame (i.e., maximizing the size of the central window on which images are displayed, and minimizing the size of the outer frames surrounding the window portion), in addition to the above-described reduction in thickness. However, generally, in the film sensor member of the touch sensor, since the routed wiring circuit formed on the peripheral frames are manufactured using a screen printing with silver paste, there are limitations for further pursuing the frame narrowing.

Accordingly, it is an object of the present invention to solve the above-described problem, i.e., to provide a capacitive type touch sensor with optical functionality, in which the intended optical functionality is performed, a thin thickness is achieved of the product to which the touch sensor is assembled, and frame narrowing is achieved.

According to a first aspect of the present invention, a capacitive type touch sensor with circularly polarized light function includes a cover glass, and a capacitive type film sensor member adhered to a rear surface of the cover glass.

The film sensor member includes:

a transparent base sheet including a λ/4 phase difference film;

a transparent conductive film formed so as to have an electrode pattern formed on a central window and a fine wiring routed circuit pattern formed on an peripheral frame, both of the patterns being formed on both sides of the base sheet; and a light-blocking conductive film laminated on each of the fine line routed circuit patterns of the transparent conductive film.

According to a second aspect of the present invention, a capacitive type touch sensor with optical functionality according to the first aspect is provided, which further includes a polarization plate between the cover glass and the film sensor member.

According to a third aspect of the present invention, a capacitive type touch sensor with optical functionality according to the first aspect or the second aspect is provided, in which the bases sheet of the film sensor member is a single layer of the λ/4 phase difference film.

According to a fourth aspect of the present invention, a capacitive type touch sensor with optical functionality according to the first aspect or the second aspect is provided, in which the base sheet of the film sensor member is a laminated body made of the λ/4 phase difference film and an optical isotropy film adhered to each other.

According to a fifth aspect of the present invention, a capacitive type touch sensor with optical functionality according to the second aspect is provided, which further includes a λ/2 phase difference film between the film sensor member and the polarization plate.

According to a sixth aspect of the present invention, a capacitive type touch sensor with optical functionality according to the second aspect is provided, in which the base sheet of the film sensor member is a laminated body made of the λ/2 phase difference film and a λ/4 phase difference film adhered to each other, and the λ/2 phase difference film of the laminated body is arranged towards the side of the polarization plate.

According to a seventh aspect of the present invention, a capacitive type touch sensor with optical functionality according to any of the first through sixth aspect is provided, in which the film sensor member includes a frame-like light-blocking layer. The frame-like light-blocking layer is formed on a periphery of the front surface of the light-blocking conductive film, on which the transparent conductive film have been formed. The frame-like light-blocking layer is made of a product based on a color resist material that has been exposed and developed.

According to the capacitive type touch sensor with optical functionality of the present invention, since the film sensor member includes the transparent base sheet having the λ/4 phase difference film, it overcomes the problem of coloring and a decrease in transmission factor due to polarization plate angle on the LCD side, when observed through the polarized sunglass. It also prevents the interference pattern (fringe) when viewed obliquely.

According to the capacitive type touch sensor with optical functionality of the present invention, the polarization plate is provided between the cover glass and the film sensor member, the film sensor member includes the transparent base sheet having the λ/4 phase difference film, and the polarization plate and the λ/4 phase difference film constituting a circularly polarized light filter. As a result, it is possible to cut off the ambient light reflected at the interface between the air layer and the film sensor member and the interface between the air layer and the display, thereby overcoming a problem of decreased contrast on the display.

In addition, since the λ/4 phase difference film is used as a base material for the conductive layer of the film sensor, and not formed as a separate member on the film sensor member, the thickness can be reduced.

In addition, since the film sensor member includes a transparent base sheet having the λ/4 phase difference film, a transparent conductive film formed on both sides of the base sheet so as to form an electrode pattern on the central window and a fine line wiring for routing on the peripheral frame, and a light-blocking layer laminated on the fine line routed circuit of the transparent conductive film, it is possible to obtain a capacitive type touch sensor with optical functionality that achieves frame narrowing in which line width and pitch of the fine line wiring for routing are narrow.

BRIEF DESCRIPTION OF THE DRAWINGS

FIG. 3 (*b*) is a sectional view showing a process of manufacturing a film sensor member shown in FIG. 1;

FIG. 3 (*c*) is a sectional view showing a process of manufacturing a film sensor member shown in FIG. 1;

FIG. 3 (*d*) is a sectional view showing a process of manufacturing a film sensor member shown in FIG. 1;

FIG. 3 (*e*) is a sectional view showing a process of manufacturing a film sensor member shown in FIG. 1;

FIG. 3 (*f*) is a sectional view showing a process of manufacturing a film sensor member shown in FIG. 1;

FIG. 3 (*g*) is a sectional view showing a process of manufacturing a film sensor member shown in FIG. 1;

FIG. 3 (*h*) is a sectional view showing a process of manufacturing a film sensor member shown in FIG. 1;

FIG. 3 (*i*) is a sectional view showing a process of manufacturing a film sensor member shown in FIG. 1;

FIG. 3 (*j*) is a sectional view showing a process of manufacturing a film sensor member shown in FIG. 1;

FIG. 3 (*k*) is a sectional view showing a process of manufacturing a film sensor member shown in FIG. 1;

FIG. 3 (*l*) is a sectional view showing a process of manufacturing a film sensor member shown in FIG. 1;

FIG. 3 (*m*) is a sectional view showing a process of manufacturing a film sensor member shown in FIG. 1;

DETAILED DESCRIPTION OF EMBODIMENTS

Figure 1:
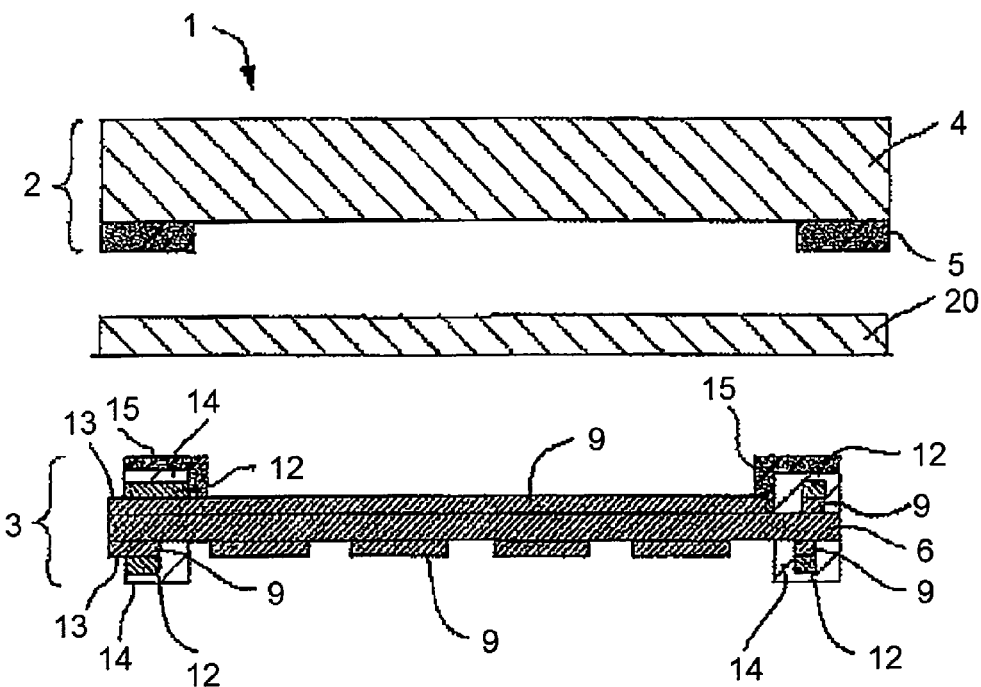
FIG. 1 is an explosive sectional view showing one embodiment of a capacitive type touch sensor with optical functionality according to the present invention.
Figure 2:
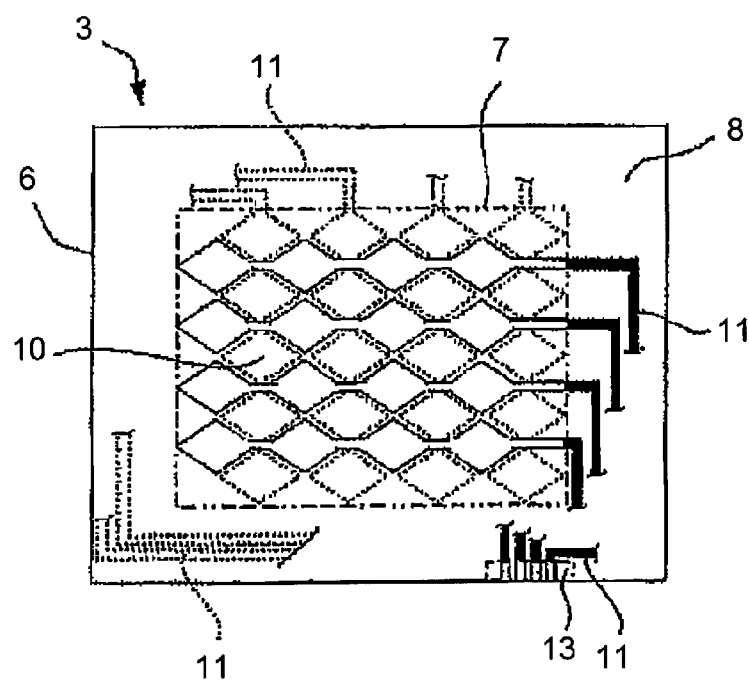
FIG. 2 is a view for explaining about one example of an electrode pattern and a fine line routed circuit pattern of the capacitive type film sensor member.

Below, referring to figures, the present invention will be explained in detail. FIG. 1 is an explosive sectional view showing one embodiment of a capacitive type touch sensor with optical functionality according to the present invention. FIG. 2 is a view for explaining one example of an electrode pattern and a fine line routed circuit pattern of the capacitive type film sensor member. In the figures, "1" represents a capacitive type touch sensor with optical functionality, "2" represents a cover glass, "3" represents a film sensor member, "4" represents a glass substrate, "5" represents a frame-like decoration layer, "6" represents a λ/4 phase difference film, "7" represents a central window, "8" represents a peripheral frame, "9" represents a transparent conductive film, "10" represents an electrode pattern, "11" represents a fine line routed circuit pattern, "12" represents a light-blocking conductive film, "13" represents terminals, "14" represents an anticorrosion functional layer, "15" represents a frame-like light-blocking layer, and "20" represents a polarization plate. It should be noticed that adhesive layers for adhering the members are omitted in the each of the explosive views in the figures.

The capacitive type touch sensor with optical functionality 1 shown in FIG. 1 includes: a cover glass 2 of a display window of the electric devices, which is composed of a transparent glass substrate 4 and a frame-like decoration layer 5 formed on a periphery of the rear surface of the transparent glass substrate 4 as a screen printing film; and a capacitive type film sensor member 3 adhered to a rear surface of the cover glass 2. The capacitive type touch sensor is one having circularly polarized light function due to a polarization plate 20 between the cover glass 2 and the film sensor member 3.

The cover glass 2 of the display window of the electric devices is arranged on a display device of an electronic apparatus (not shown) to protect the display device.

The glass substrate 4 of the cover glass 2 may be a transparent glass plate such as a colorless transparent soda lime silicate glass, an alminosilicate glass, a lithium aluminosilicate glass, a silica glass, an alkali-free glass, and other kinds of glasses. The plate thickness of the glass substrate 4 mentioned above is preferably between 0.3 and 0.7 mm, and more preferably between 0.4 and 0.55 mm. If the plate thickness of the glass substrate 4 is within this range, the balance among strength, plate thickness and weight of the obtained cover glass 2 of the present invention is excellent and preferable. The glass substrate 4 does not have to be flat, i.e., it can also employ a curved surface. An antireflection film may be provided for reducing glare toward the glass surface due to the reflection. A hard coat film may be provided for improving the abrasion resistance.

The frame-like decoration layer 5 of the cover glass 2 may be a coloring including resin as a binder such as polyvinyl resin, polyamide resin, polyester resin, polyacrylic resin, polyurethane resin, polyvinyl acetal resin, polyester-urethane resin, and alkyd resin, and pigment or dye having an appropriate color as a colorant.

The polarization plate 20 is made by laminating a protection layer onto a polarized film described below, on one surface or both surfaces as necessary. As a polarized film, for example, (i) iodine and/or dichroic organic dye polarization film, which is made by absorbing and orienting iodine and/or dichroic organic dye to a hydrophilic macromolecule film such as polyvinyl alcohol film, partially formalized polyvinyl alcohol film, ethylene-vinyl acetate copolymer saponified film, and cellulose film;

(ii) polyene polarized film, which is made by hydronizing polyvinyl alcohol film to form polyene and orient it;

(iii) polyene polarized film, which is made by dehydrochlorination of polyene polyvinyl chloride film to form polyene and orient it. These films typically have a thickness of 10 to 80 μm. The protection layer may be made of TAC (Triacetate Cellulose) film, for example.

According to the present invention, the film sensor member 3 includes: a transparent base sheet made of a single layer of λ/4 phase difference film 6; transparent conductive films 9 formed on both sides of the base sheet such that it includes an electrode pattern 10 in the central window 7 and a fine line routed circuit pattern 11 in the peripheral frame 8; the light-blocking conductive films 12 formed on the fine line routed circuit patterns 11 of the transparent conductive films 9 so as to have the same width as that of the fine line routed circuit patterns 11; the anticorrosion functional layer 14 formed on both sides of the base sheet on which the transparent conductive films 9 and light-blocking conductive films 12 have been formed so as to cover the peripheral frames 8 except for the terminals 13; and the frame-like light-blocking layer 15 formed on periphery of the front surface of the base sheet on which the transparent conductive film 9, the light-blocking conductive film 12 and the anticorrosion functional layer 14 have been formed, the light-blocking layer 15 being made of a product based on a color resist material that has been exposed and developed. The inner edge of this second frame-like light-blocking layer 15 is positioned closer to the center than the inner edge of the frame-like decoration layer 5 of the cover glass 2.

Figure 4:
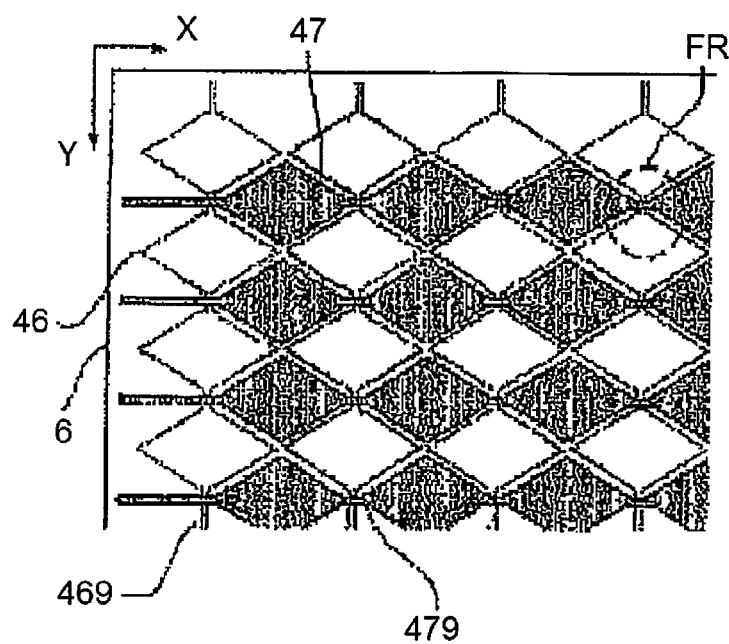
FIG. 4 is a plane view for explaining about one example of shape and arrangement aspect of an electrode pattern formed on the central window of the film sensor member.

One example of the electrode pattern 10 formed on the central window 7 of the film sensor member 3 will be described. The electrode patterns 10 have different patterns on either side. For example, if the self capacitance type film sensor member is employed, as shown in FIG. 4, on the backside of the base sheet (the λ/4 phase difference film 6), it includes rhombus electrodes 46 having a rhombus shape in a plan view, and interconnecting wirings 469 arranged to penetrate a plurality of the rhombic electrodes 46 in the longitudinal direction (Y direction). The plurality of rhombus electrodes 46 and the connection wirings 469 are electrically connected to each other. In addition, there are a plurality of sets of the connection wirings 469 and a plurality of rhombus electrodes 46 penetrated thereby arranged repeatedly in the horizontal direction (X direction) in the figure. On the other hand, similarly to this, a plurality of rhombus electrodes 47 are disposed and interconnecting wirings 479 are arranged to penetrate them on the front side of the base sheet (λ/4 phase difference film 6). However, in this case, the extending direction of the connection wirings 479 is different from that of the connection wirings 469 and is the horizontal direction (X direction) in the figure. In addition, in accordance with this, the sets of the connection wirings 479 and the plurality of rhombus electrodes 47 penetrated thereby are arranged repeatedly in the vertical direction (Y direction) in the figure. Further, as apparent from FIG. 4, the rhombus electrodes 46 are disposed to fill spaces between the plurality of connection wirings 479, while the rhombus electrodes 47 are disposed to fill spaces between the plurality of connection wirings 469. Further in FIG. 4, the rhombus electrodes 46 and the rhombus electrodes 47 are arranged in a complementary manner. In other words, when the rhombus electrodes 46 are arranged in a matrix, rhombus spaces are formed, and the plurality of rhombus electrodes 47 are arranged to fill the rhombus spaces.

In this way, because the X direction electrodes and the Y direction electrodes are arranged to form a lattice in a plan view, when a user's finger or the like touches a position on the lattice (for example, a position indicated by broken line circle FR) through the cover glass 2, a capacitor is formed between the finger or the like and the X direction electrode touched thereby. In addition, a capacitor is formed between the finger or the like and the Y direction electrode touched thereby. When the capacitors are formed, capacitances of the X direction electrode and the Y direction electrode increase. A position detection unit of the external circuit detects the amount of variation of the capacitance generated in this case, or further detects the X direction electrode and the Y direction electrode having the maximum capacitance, so as to obtain the touched position in the center window 7 as a specific value that represents a set of an X coordinate and a Y coordinate.

A method of obtaining a film sensor member 3 having the above-described structure will be described in detail, below.

<Developing a Pattern in the Transparent Conductive Film 9>

First, transparent conductive films 9, 9, the light-blocking conductive films 12, 12, and the first photoresist layers 16, 16 are formed on the entire surface of both sides of a base sheet made of a single layer of a λ/4 phase difference film 6, in this order, to obtain a conductive sheet (refer to FIG. 3 (a)). After that, masks having a desired pattern 17 are placed thereon, and exposure (refer to FIG. 3 (b)) and development are performed to develop a pattern on the first photoresist layer 16. It should be noticed that the position of the mask 17 shown in FIG. 3 (b) indicates a case in which the first photoresist layer 16 is negative-type (if it is exposed, the solubility with the development liquid is decreased so that the exposed portions remain after the development). If a positive-type (if it is exposed, the solubility with the development liquid increases, so that exposed portions are removed) is employed, the portions to which the light is blocked by the masks is reversed.

As a method of obtaining a film giving $\lambda/4$ phase difference, for example, there is a method of uniaxially extending (or biaxially extending sequentially or simultaneously) a film made of a high polymer with a photoelastic constant equal to or less than $70*10^{-12}\,Pa^{-1}$ to develop a $\lambda/4$ phase difference in the polymeric film itself, or a method of providing a layer of compound (a layer made of polymer liquid crystal, for example) on a polymeric film having photoelastic constant equal to or less than $70*10^{-12}\,Pa^{-1}$ to develop a $\lambda/4$ phase difference.

Here, "giving $\lambda/4$ phase difference" ideally means that $\lambda/4$ phase difference is given to all of the wavelengths in the visible light range. However, if the phase difference at the wavelength 550 nm is $\lambda/4$, it does not cause any practical problems even if the phase difference is a little bit deviated from $\lambda/4$ at other wavelengths. The retardation value ($\Delta nd$) at the wavelength 550 nm is preferably between 125 and 150 nm, more preferably between 131 and 145 nm.

The transparent conductive film 9 is a layer made of metallic oxides such as indium tin oxide and zinc oxide, and may be formed with a vacuum deposition method, sputtering, ion plating, electroplating method, etc. In addition, the transparent conductive film 9 is formed so as to have a thickness between a few tens nm and a few hundreds nm, and can be easily etched together with the light-blocking conductive film 12 using a solution such as ferric chloride, and must not be easily etched with the etching liquid for the light-blocking conductive film 12 such as hydrogen peroxide solution under the acidic atmosphere. And, it is preferable to show a light transmittance of 80% or more, and surface resistance value from a few m$\Omega$ to a few hundreds $\Omega$.

The light-blocking conductive film 12 is a layer made of a single metal film having a high conductivity and good light blocking effect, or made of alloys or compounds of such metal, and can be formed with methods such as vacuum deposition method, sputtering, ion plating, and an electroplating method. It is also necessary to use etchant with which the light-blocking conductive film 12 is etched but the transparent conductive film 9 is not. Examples of the favorable metal are aluminum, nickel, copper, silver, and tin. Especially, the metal film made of copper foil having a thickness between 20 nm and 1000 nm are very preferable because it shows excellent conductivity and light blocking effect, and it can be easily etched with the hydrogen peroxide solution under the acidic atmosphere under which transparent conductive film is not etched. More preferably, the thickness is 30 nm or more. More preferably, the thickness is 100 to 500 nm. The reason is that if the thickness is set to be 100 nm or more, it is possible to obtain the light-blocking conductive film 12 having a high conductivity, and if the thickness is 500 nm or less, it is possible to obtain the light-blocking conductive film 12 having excellent easiness of handling and processability.

The first photoresist layer 16 is made of acrylic photoresist material having a thickness between 10 μm to 20 μm, which is exposed by a high-pressure mercury vapor lamp, an ultrahigh pressure mercury lamp, a laser light beam or a metal halide lamp, and is developed with alkali solution or so. The first photoresist layer 16 can be formed on the entire surface using various methods including general-purpose printing methods such as gravure, screen, and offset, various methods using a coater, paint, or dipping, and a dry film resist method, and then the exposure and development are performed to develop a pattern. Among the various methods, the dry film resist method is preferable.

The dry film resist (DFR) used in the dry film resist method is a film in which photosensitive layers, which will become photoresist layers, are sandwiched between a base film and a cover film. The above-described printing, coating, painting methods have a problem of inefficiency because of one-sided coating. In contrast, the dry film resist method is a method of adhering the photosensitive layer with a heating roll after the cover film is removed. As a result, the productivity is high and satisfies various requirements, so that the dry film resist method has become mainstream. It should be noticed that the exposure is normally performed by arranging the mask (not shown) on the base film and the development is performed after the base film is removed. As a base sheet of the dry film resist, one made of polyethylene terephthalate can be used. In addition, as a cover film of the dry film resist, one made of polyethylene can be used.

According to the present invention, during the exposure, since the light-blocking conductive film 12 blocks the exposure light beam 32 from the opposite side, even if different mask patterns are simultaneously used, the exposure light beam 32 does not affect the pattern of the first photoresist layer 16 on the opposite side. Accordingly, since it is possible to simultaneously expose the light onto both sides, it is easier to adjust positions of the first photoresist layers 16 on both sides, so that it is possible to develop patterns on both sides by a single process, thereby improving the productivity.

Note that alignment between the front mask and the rear mask can be performed by using a known mask alignment method of a double-sided exposing apparatus. For instance, an alignment method between the front mask and the rear mask is as follows. Mask alignment marks are formed on the front mask and the rear mask, and an optical reading sensor such as a camera reads an overlaid state of the pair of mask alignment marks so as to obtain relative positional information between the front mask and the rear mask. Then, based on the obtained positional information, a mask position adjustment mechanism moves the front mask and the rear mask relatively to each other so that the pair of mask alignment marks are overlaid correctly.

Next, using the etching liquid such as ferric chloride, the transparent conductive films 9, 9 and the light blocking conductive films 12, 12 are simultaneously etched so that the transparent conductive films 9, 9 and the light blocking conductive films 12, 12 of the part on which the first photoresist layers 16, 16 after patterning is not laminated are removed. Thus, the transparent conductive films 9, 9 and the light blocking conductive film 12, 12 are laminated without misregistration to form the electrode pattern 10 in the center window 7 on both sides of the base sheet, and the transparent conductive films 9, 9 and the light blocking conductive films 12, 12 are laminated without misregistration to form the fine wiring circuit pattern 11 on the peripheral frame 8 on both sides of the base sheet (see FIG. 3(c)).

Since the transparent conductive films 9, 9 and the light-blocking conductive films 12, 12 are etched by using the first photoresist layers 16, 16 on which a precise and detailed pattern has been developed with photo-lithography process, it is possible to make narrow line width and pitch of the fine line wiring for routing. For example, it is possible to form the fine line wiring for routing having a line width of 1 mm or less.

<Removing Unnecessary Light-Blocking Conductive Film 12>

Next, with the photoresist stripping liquid, the first photoresist layers 16, 16 are removed and the light-blocking conductive films 12, 12 are revealed. After that, on both sides, the second photoresist layers 18, 18 are formed on the entire surface (refer to FIG. 3(d)). Then, the masks 19, 19 are placed thereon, and the exposure (refer to FIG. 3(e)) and development are performed to develop a pattern on the second photoresist layer 18 (refer to FIG. 3(f)). It should be noticed that the position of the masks 19 shown in FIG. 3 (e) indicates a case in which the second photoresist layer 18 is negative-type (if it is exposed, the solubility with the development liquid is decreased, so that the exposed portions remain after the development). The material and forming method for the second photoresist layer 18 can be the same as those of the first photoresist layer 16.

Next, etching is performed with the special etching liquid such as acidified hydrogen peroxide so that the light blocking conductive films 12, 12 are removed only at the part where the second photoresist layers 18, 18 after patterning is not laminated. Thus, the transparent conductive films 9, 9 are revealed in the center window 7 and the terminal portions 25 of the peripheral frame 8 on both sides of the base sheet (refer to FIG. 3(g) and FIG. 2).

If the transparent conductive film 9 is made of amorphous material, it is preferable to crystallize it before the etching with a method such as thermal treatment. The reason is that the crystallization improves resistance to etching, which makes it easier to selectively etch only the light-blocking conductive film 12.

<Forming of the Anticorrosion Functional Layer 14>

Next, with the photoresist stripping liquid, the second photoresist layers 18, 18 are stripped off. The light-blocking conductive films 12, 12 which are laminated on the fine line routed circuit pattern 11 with the same width as that of the fine line routed circuit pattern 11 are revealed. Then, the anticorrosive third photoresist layers 28, 28 are formed on the entire surface (refer to FIG. 3 (h)). After that, the masks 29, 29 are placed thereon, the exposure (refer to FIG. 3 (i)) and development are performed to develop a pattern on the third photoresist layers 28, 28, which become the anticorrosion functional layers 14, 14 (refer to FIG. 3 (j)). Note that the position of the masks 29 illustrated in FIG. 3(i) indicates a case where the third photoresist layer 28 is a negative type (when it is exposed, its solubility is decreased with respect to developing solution so that an exposed part remains after development).

The anticorrosive third photoresist layer 28 may be made of photoresist material similar to the first photoresist layer 16 to which an anticorrosive agent is added, or those among the previously mentioned photoresist materials having an excellent anticorrosiveness. In addition, the method of forming the third photoresist layer 28 may be the same as that of forming the first photoresist layer 16. As the anticorrosive agent, materials already known as an anticorrosive agent may be used. As specific examples, imidazole, triazole, benzotriazole, benzimidazole, benzothiazole, pyrazole, or the like can be used, for example. In addition, monocyclic or polycyclic azole group of their halogen, alkyl, or phenyl substituent and such, an aromatic amine group such as aniline, aliphatic amine such as alkyl amine, and a salt thereof can also be used. In addition, there is no need to limit the material particularly to the materials described in this description.

As mentioned before, since the anticorrosion function layer 14 is formed, even if corrosive liquid enters from the outside, or even under a test environment such as high temperature and high humidity, corrosion of wiring for routing does not proceed, so that electric characteristics can be maintained.

<Forming the Frame-Like Light-Blocking Layer 15>

Figure 3A:
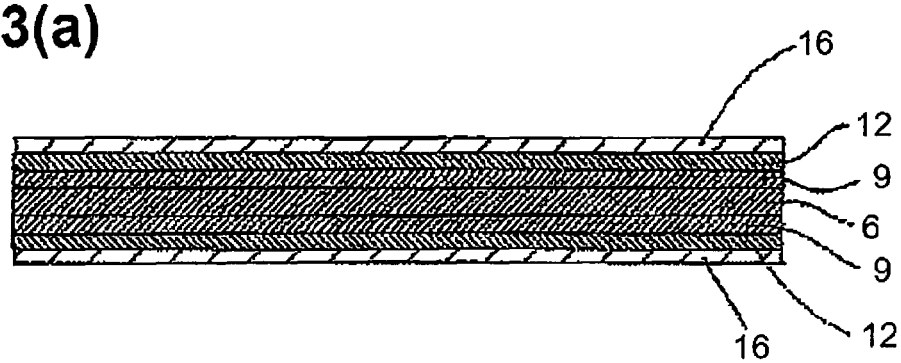
FIG. 3 (*a*) is a sectional view showing a process of manufacturing a film sensor member shown in FIG. 1.
Figure 3B:
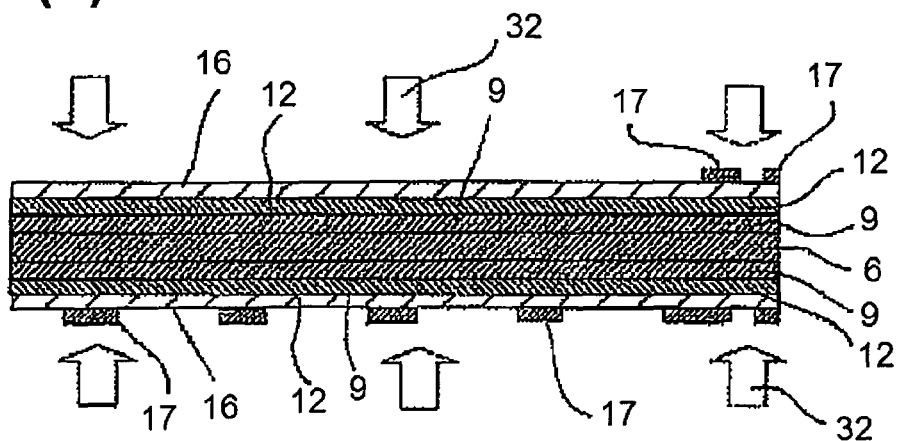
Figure 3C:
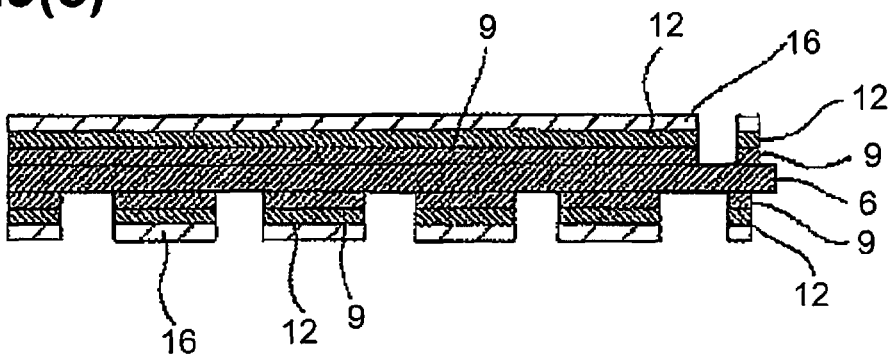
Figure 3D:
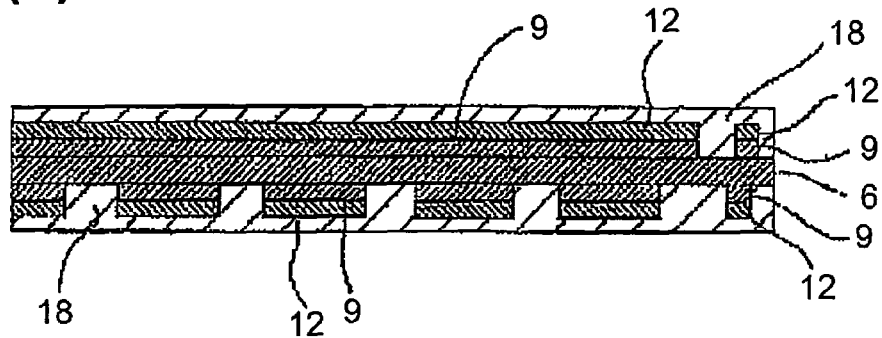
Figure 3E:
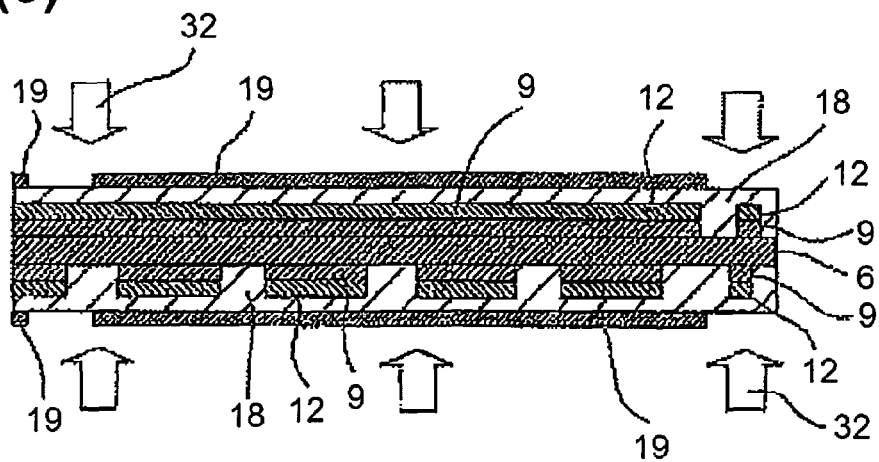
Figure 3F:
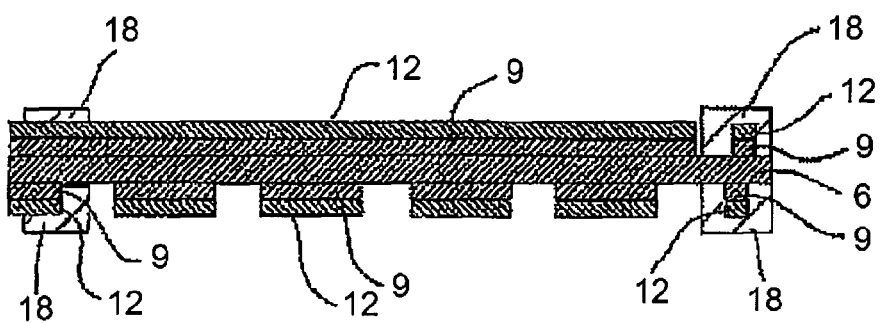
Figure 3G:
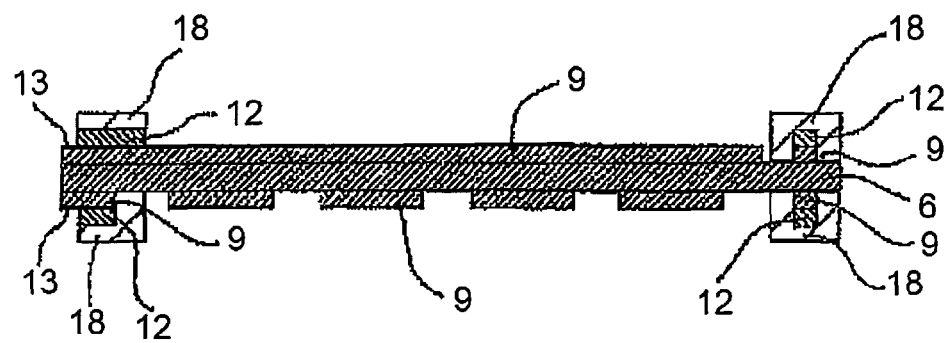
Figure 3H:
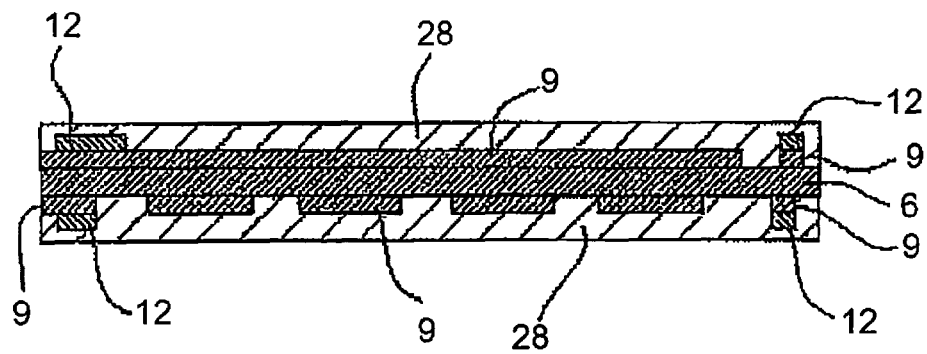
Figure 3I:
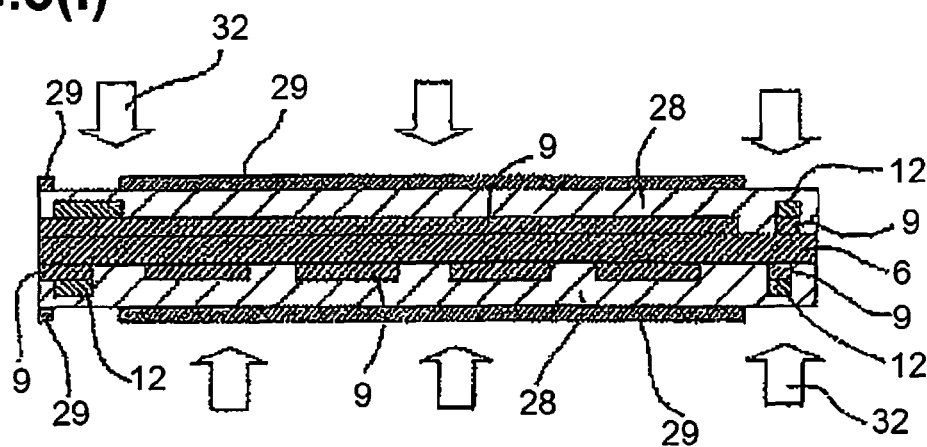
Figure 3J:
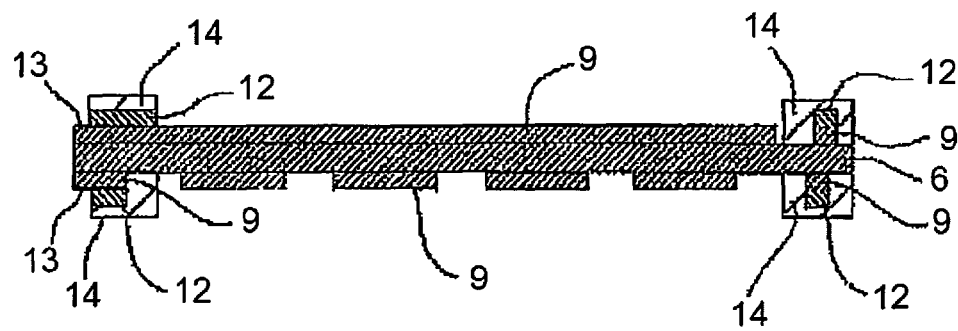
Figure 3K:
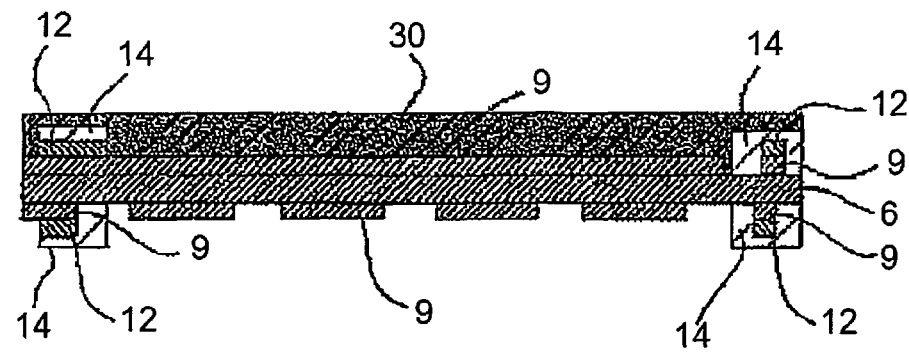
Figure 3L:
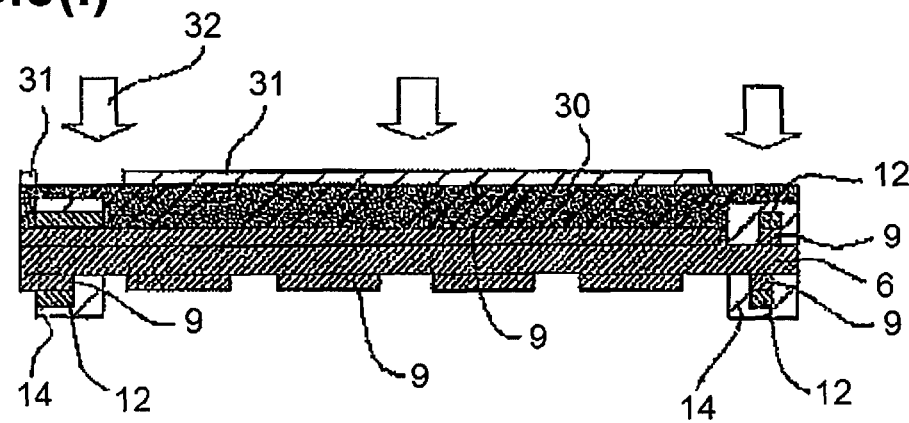
Figure 3M:
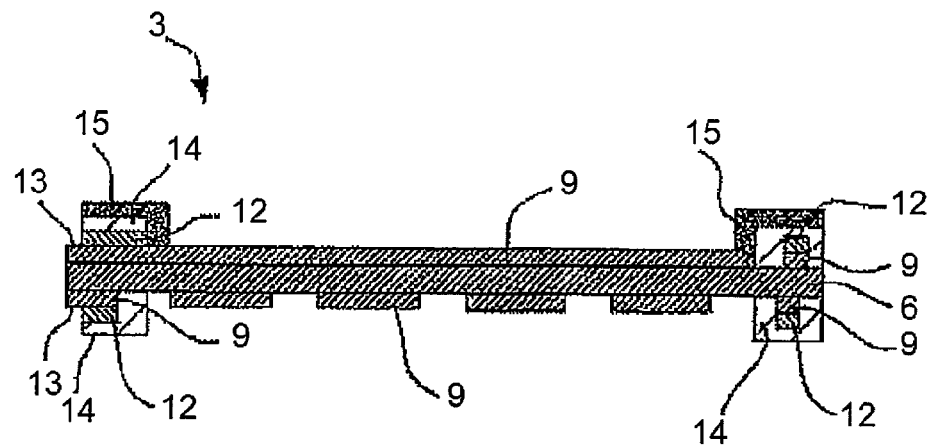

Finally, the fourth photoresist layer 30 made of color resist material is formed on the entire surface of only the front surface (see FIG. 3(k)). After that, the masks 31, 31 are placed thereon, and exposure (see FIG. 3(l)) and development are performed so as to develop a pattern on the fourth photoresist layer 30 to make a frame-like light-blocking layer 15 (refer to FIG. 3 (m)). Note that the position of the masks 31 illustrated in FIG. 3(l) indicates a case where the fourth photoresist layer 30 is a negative type (when it is exposed, its solubility is decreased with respect to developing solution so that an exposed part remains after development).

Since the second frame-like light-blocking layer 15 is formed by photo processes shown in FIG. 3 (k) to FIG. 3 (m), linearity of the inner edge is improved. According to the present invention, since the inner edge of the second frame-like light-blocking layer 15 is positioned closer to the center than the inner edge of the first frame-like decoration layer 5 of the cover glass 2 formed by screen printing, the outline of the display screen to be seen through the cover glass 2 becomes sharp. It should be noted that the difference between the dimension between the inner edges of the second frame-like light-blocking layer 15 and the dimension between the inner edges of the first frame-like light-blocking layer 5 is preferably 0.1 mm to 0.3 mm. If the difference is less than 0.1 mm, printing errors or adherence errors of the first frame-like decoration layer 5 may result in a side where the second frame-like light-blocking layer 15 is not revealed. If the difference exceeds 0.3 mm, it becomes difficult to achieve a narrow frame.

The color resist material used for the fourth photoresist layer 30 can be similar to the resist for RGB and black matrix constituting a color filter for the LCD display. Further, the method for forming the fourth photoresist layer 30 can be similar to that for forming the first photoresist layer 16.

According to the present invention, the adhesive layers (not shown) used for adhering the members are preferably optically clear adhesive layers (OCA).

Figure 5:
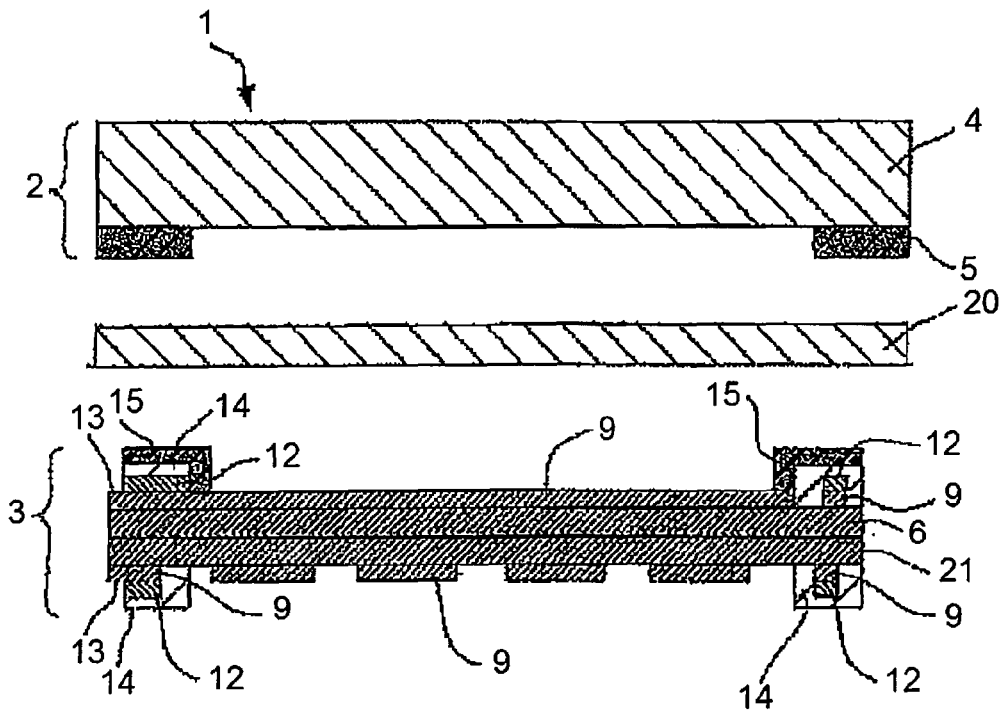
FIG. 5 is an explosive sectional view showing an other embodiment of the capacitive type touch sensor with optical functionality according to present invention.

Although one embodiment of the capacitive type touch sensor with optical functionality is explained above, the present invention is not limited to the one. For example, the base sheet is not limited to one made of a single layer of the λ/4 phase difference film 6 as shown in the figures, and the base sheet can be a laminated body made of a λ/4 phase difference film 6 and an optical isotropy film 21 adhered to each other (refer to FIG. 5). It should be noticed that if the base sheet is made of a single layer of the λ/4 phase difference film 6, the number of adhesive layers can be decreased, and the possibility of light leakage will be reduced.

The optical isotropy film 21 can be a film having a retardation (Δnd) value of 30 nm or less, including polycarbonate resin, polysulfone resin such as polysulfone, polyethersulfone, and polyarylsulfone, polyolefin resin. acetate resin such as cellulose triacetate, and polyarylate resin, and having a thickness between 10 μm and 200 μm.

Means for laminating the λ/4 phase difference film 6 and the optical isotropy film 21 may be dry laminate with adhesive layers. The λ/4 phase difference film 6 and the optical isotropy film 21 may be laminated at any timing after the transparent conductive film 9 is formed on the λ/4 phase difference film 6 and optical isotropy film 21, after the light-blocking conductive film 12 is laminated, or after the first photoresist layer 16 is laminated.

Figure 6:
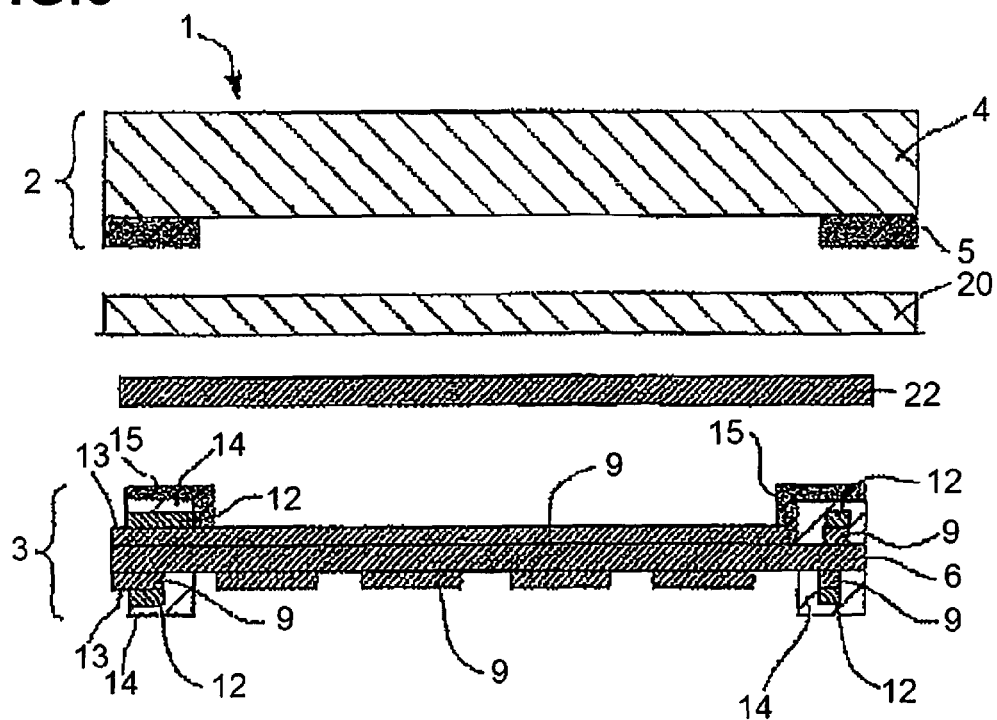
FIG. 6 is an explosive sectional view showing an other embodiment of the capacitive type touch sensor with optical functionality according to present invention.

Furthermore, the capacitive type touch sensor with optical functionality 1 according to the present invention may further include a λ/2 phase difference film 22 between a film sensor member 3, which has the above-described single layer of λ/4 phase difference film 6 as a base sheet, and the polarization plate 20 (refer to FIG. 6). In this case, it is preferable because the laminated body as a whole achieves λ/4 phase difference, which is excellent in the broadband.

As a method of obtaining a film for giving λ/2 phase difference, for example, there is a method of uniaxially extending (or biaxially extending sequentially or simultaneously) a film made of a high polymer having photoelastic constant of $70*10^{-12}$ $Pa^{-1}$ to develop a λ/2 phase difference in the polymeric film itself, or a method of providing a layer of compound (a layer made of polymer liquid crystal, for example) to develop a λ/2 phase difference on the polymeric film having photoelastic constant of $70*10^{-12}$ $Pa^{-1}$ or less.

Figure 7:
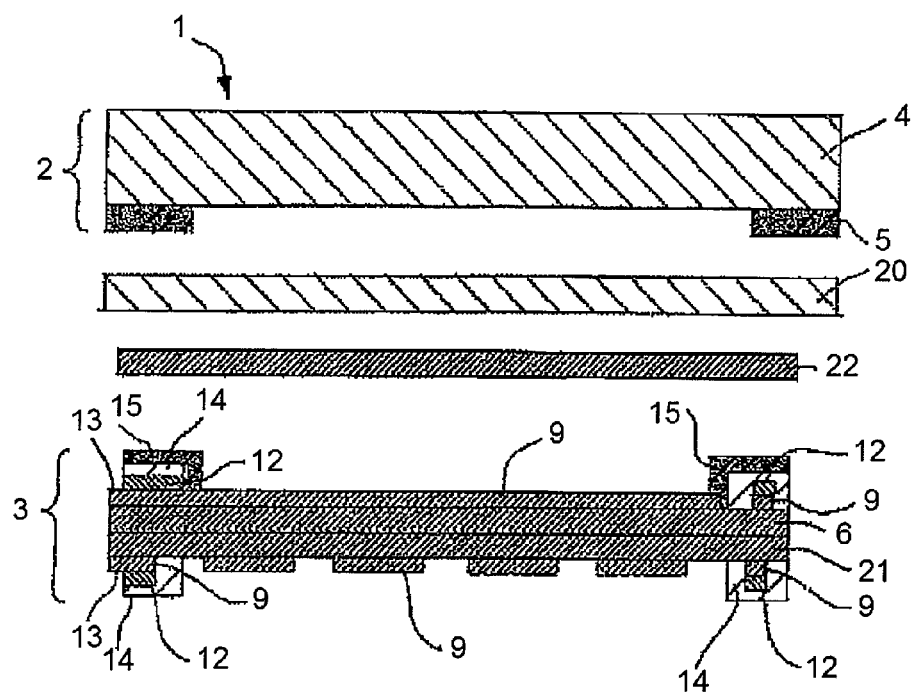
FIG. 7 is an explosive sectional view showing an other embodiment of the capacitive type touch sensor with optical functionality according to present invention.

Furthermore, the capacitive type touch sensor with optical functionality 1 according to the present invention may further include a λ/2 phase difference film 22 between the film sensor member 3, which has the above-described laminated body made of the λ/4 phase difference film 6 and the optical isotropy film 21, and the polarization plate 20 (refer to FIG. 7).

Figure 8:
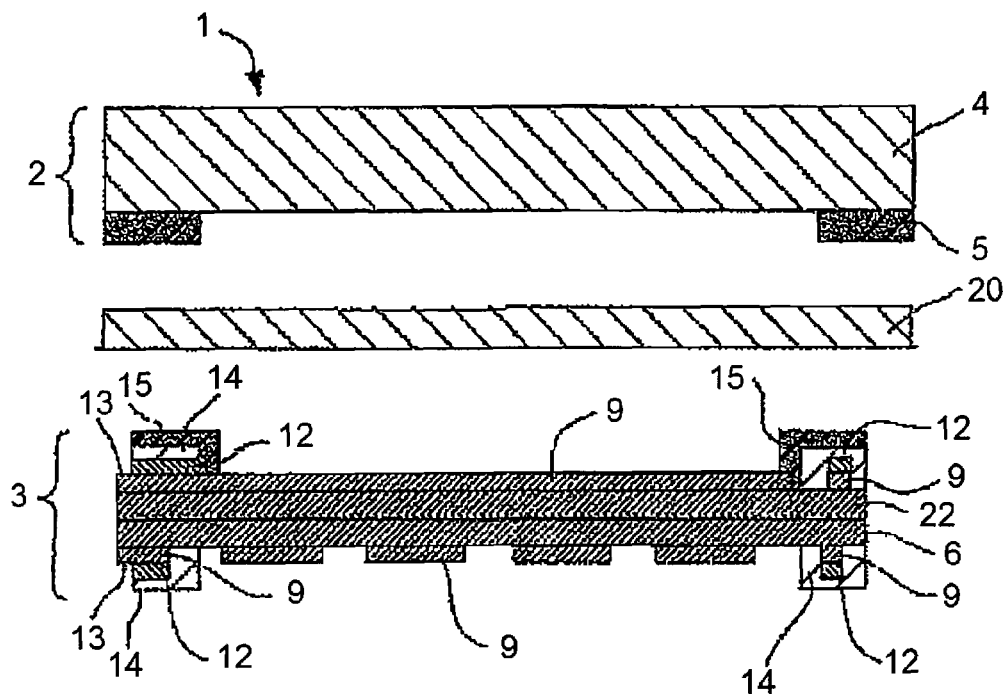
FIG. 8 is an explosive sectional view showing an other embodiment of the capacitive type touch sensor with optical functionality according to present invention.

Furthermore, in the capacitive type touch sensor with optical functionality 1 according to the present invention, the base sheet of the film sensor member 3 may be a laminated body made of the λ/2 phase difference film 22 and the λ/4 phase difference film 6 adhered to each other, and the λ/2 phase difference film 22 of the laminated body is arranged near the polarization plate 20 (refer to FIG. 8).

Means for laminating the λ/2 phase difference film 22 and the λ/4 phase difference film 6 may be a dry laminate with adhesive layers, for example. The λ/2 phase difference film 22 and the λ/4 phase difference film 6 may be laminated at any timing, e.g., after forming the transparent conductive film 9 onto the λ/2 phase difference film 22 and the λ/4 phase difference film 6, after laminating the light-blocking conductive film 12, or after laminating the first photoresist layer 16.

Furthermore, in the capacitive type touch sensor with optical functionality 1 according to the present invention, the anticorrosion functional layer 14 may be omitted, and the frame-like light-blocking layer 15 may be omitted.

Furthermore, in the capacitive type touch sensor with optical functionality 1 according to the present invention, the anticorrosion functional layer on the front side may be made of a product based on a color resist material that has been exposed and developed and may be used as the frame-like light-blocking layer 15.

Furthermore, although in FIG. 2 and FIG. 4 the electrode pattern of a self capacitance type film sensor member is shown, the present invention is not limited to this type, and the electrode pattern of a mutual capacitance type film sensor member may be formed.

Figure 9:
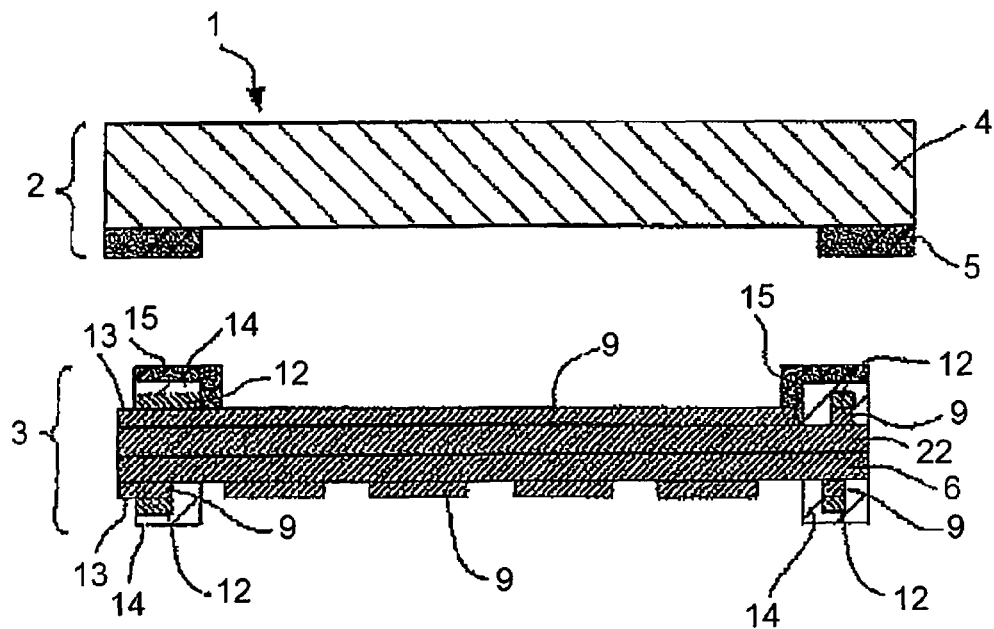
FIG. 9 is an explosive sectional view showing an other embodiment of the capacitive type touch sensor with optical functionality according to present invention.

Although a touch sensor is described above, whose purpose is to achieve circularly polarized light function with the polarization plate 20 between the cover glass 2 and the film sensor member 3, a touch sensor may also be employed as shown in FIG. 9, whose purpose is to only achieve a function of giving a phase difference without the polarization 20 (specifically, achieving measures against the fringe and handling of the polarized sunglass). The phase difference given, for addressing fringe or the polarized sunglass, is preferably between 80 and 120 nm, and most preferably 100 nm. In addition, considering the accuracy of forming the electrode pattern, i.e., the dimensional stability, the phase difference film is preferably pre-annealed, and has preferably a heating contraction coefficient of 0.1% or less at 140 degrees Celsius*90 degree Celsius. The elements and the method of forming them are the same as in the example above, except for the polarization plate 20, so the explanation will be omitted.

Working Example 1

A λ/4 phase difference film having a thickness of 200 μm was prepared as a base sheet. On both sides of the base sheet, indium tin oxide was formed as a transparent conductive film having a thickness of 200 nm by sputtering, on which a copper film having a thickness of 500 nm as a light-blocking conductive film was formed by sputtering, to prepare a conductive film. Next, a first photoresist layer having a thickness of 10 nm was formed on the entire surface of both sides of the conductive film. The first photoresist layer was formed using a dry film resist which includes an acrylic photosensitive layer of negative-type, which can be developed with sodium carbonate 1% liquid. Then, with a mask having X-direction electrode pattern on the front side, and with a mask having Y-direction electrode pattern on the rear side, both front and rear surfaces were simultaneously exposed with a metal halide lamp, and then the laminated body was dipped into the sodium carbonate 1% liquid for development.

Next, using an etching liquid such as aqueous ferric chloride, portions of indium tin oxide film and copper film, where the patterned first photoresist layer had not been laminated, were etched and removed simultaneously. As a result, X-direction electrode pattern was revealed and formed on the surface of the central window of the base sheet, and Y-direction electrode pattern was revealed and formed on the opposite side. On the peripheral frame surrounding the central window, a fine line routed pattern having an average line width of 20 μm was formed on both front surface and rear surface.

Next, after stripping off the first photoresist layer, a second photoresist layer having a thickness of 10 nm was formed on the entire surfaces of both sides, using dry film resist which can be developed with sodium carbonate 1% liquid and has an acrylic photosensitive layer of negative type. Then, masks were placed on the peripheral frame except the terminals on both the front surface and the rear surface. Then, both front surface and rear surface were exposed simultaneously with a metal halide lamp, and then were dipped into the sodium carbonate 1% liquid for development.

Next, in an acidic atmosphere, by dipping into hydrogen peroxide solution, the revealed copper film on the revealed central window was etched and removed, so that only the indium tin oxide film formed under the copper film remained.

Next, after the second photoresist layer was stripped off, using a dry film resist which can be developed using sodium carbonate 1% liquid and includes an acrylic photosensitive layer of negative type to which benzimidazole as an anticorrosive agent was added, the third photoresist layer having a thickness of 10 nm was formed on the entire surface of both sides. On the third photoresist layer, a mask was placed on the peripheral frame except the terminals. Then, both front surface and rear surface were simultaneously exposed with a metal halide lamp, and then were dipped into the sodium carbonate 1% liquid for development. The third photoresist layer remained as the anticorrosion functional layer.

Next, using dry film resist which can be developed using sodium carbonate 1% liquid and includes an acrylic photosensitive layer of negative type made of color resist material of black color, the fourth photoresist layer having a thickness of 5 μm was formed on the entire surface of only the front surface. A mask was placed on the fourth photoresist layer, and then only the front surface was exposed with a metal halide lamp. Then, it was dipped into the sodium carbonate 1% liquid for development. As a result, the fourth photoresist layer of black color remained as the second frame-like light-blocking layer. Then, a single unit of the film sensor was cut off.

On the other hand, a cover glass was obtained by forming a frame-like decoration layer having a thickness of 7 μm with black ink by screen printing on a periphery of the rear surface of a glass substrate made of borosilicate glass having thickness of 0.7 mm.

In addition, a polarization plate 20 having a thickness of 150 μm was obtained by adhering, with adhesive, triacetate films to both sides of a monoaxially-oriented polyvinyl alcohol film containing iodine as polarizer.

Finally, the polarization plate is adhered, with adhesive, onto the rear surface of the cover glass so as to sandwich the polarization plate between the previously obtained film sensor member and the cover glass, thereby making a capacitive type touch sensor with optical functionality.

Working Example 2

The following points are the only ones different from the working example 1. A transparent conductive film having a thickness of 200 nm was formed by sputtering indium tin oxide onto one surface of a PC film having a thickness of 200 μm. Onto it, a copper film that serves as a light-blocking conductive film having a thickness of 500 nm was formed, by sputtering, to prepare a first conductive film. In addition, a transparent conductive film having a thickness of 200 nm was formed by sputtering indium tin oxide onto one surface of a λ/4 phase difference film having a thickness of 200 μm. Onto it, a copper film that serves as a light-blocking conductive film having a thickness of 500 nm was formed, by sputtering, to prepare a second conductive film. Next, the first and second conductive films were laminated with adhesive to obtain a laminated body in which a pair of the transparent conductive film and the light-blocking conductive film was laminated on both sides of the base sheet.

Working Example 3

A λ/2 phase difference film having a thickness of 200 μm was interposed between the film sensor member and the polarization plate. This is the only difference from the working example 1.

Working Example 4

A λ/2 phase difference film having a thickness of 200 μm was interposed between the film sensor member and the polarization plate. This is the only difference from the working example 2.

Working Example 5

A λ/2 phase difference film having a thickness of 200 μm was used instead of the PC film in the first conductive film. This is the only difference from the working example 2.

Working Example 6

The polarization plate was not interposed between the film sensor member and the cover glass. This is the only difference from the working example 1.

According to any of the above embodiments, the capacitive type touch sensor with optical functionality was obtained, in which thickness of embedded product is thin and the frame is narrow, while performing a desired optical functionality.

The present invention relates to capacitive type touch sensor with optical functionality to be attached to LCD display portion of electronic devices such as portable information terminals such as PDAs and handy terminals, office automation equipment such as copying machines, facsimile apparatuses, and smartphones, portable phones, portable game devices, electronic dictionaries, car navigation systems, small PCs, digital cameras, video cameras, and portable MDs (PMD).

The invention claimed is:

1. A capacitive type touch sensor with optical functionality, the touch sensor comprising:
    a cover glass;
    a capacitive type film sensor member adhered to a rear surface of the cover glass; and
    a polarization plate between the cover glass and the film sensor member;
    the film sensor member including:
        a transparent base sheet including a λ/4 phase difference film, the base sheet of the film sensor member being a laminated body made of a λ/2 phase difference film and the λ/4 phase difference film adhered to each other, and the λ/2 phase difference film of the laminated body being arranged nearer to the polarization plate;
        a transparent conductive film formed on both sides of the base sheet so as to have, on each of the sides of the base sheet, an electrode pattern formed on a central window and a fine line routed circuit pattern formed on a peripheral frame; and
        a light-blocking conductive film laminated on each of the fine line routed circuit patterns of the transparent conductive film with the same width as that of the transparent conductive film while the transparent conductive film is revealed at terminal portions.

2. The capacitive type touch sensor with optical functionality according to claim 1, wherein the film sensor member includes a frame-like light-blocking layer, the frame-like light-blocking layer being formed on a periphery of the front surface of the base sheet, on which the transparent conductive film and the light-blocking conductive film have been formed, and the frame-like light-blocking layer being made of a product based on a color resist material that has been exposed and developed.

3. A capacitive type touch sensor with optical functionality, the touch sensor comprising:
    a cover glass;
    a capacitive type film sensor member adhered to a rear surface of the cover glass, the film sensor member including:
        a transparent base sheet including a λ/4 phase difference film;
        a transparent conductive film formed on both sides of the base sheet so as to have, on each of the sides of the base sheet, an electrode pattern formed on a central window and a fine line routed circuit pattern formed on a peripheral frame; and
        a light-blocking conductive film laminated on each of the fine line routed circuit patterns of the transparent conductive film;
    a polarization plate between the cover glass and the film sensor member; and
    a λ/2 phase difference film between the film sensor member and the polarization plate.

4. The capacitive type touch sensor with optical functionality according to claim 3, wherein the film sensor member includes a frame-like light-blocking layer, the frame-like light-blocking layer being formed on a periphery of the front surface of the base sheet, on which the transparent conductive film and the light-blocking conductive film have been formed, and the frame-like light-blocking layer being made of a product based on a color resist material that has been exposed and developed.

5. A capacitive type touch sensor with optical functionality, the touch sensor comprising:
   a cover glass;
   a capacitive type film sensor member adhered to a rear surface of the cover glass, the film sensor member including:
      a transparent base sheet including a λ/4 phase difference film;
      a transparent conductive film formed on both sides of the base sheet so as to have, on each of the sides of the base sheet, an electrode pattern formed on a central window and a fine line routed circuit pattern formed on a peripheral frame;
      a light-blocking conductive film laminated on each of the fine line routed circuit patterns of the transparent conductive film; and
      a frame-like light-blocking layer, the frame-like light-blocking layer being formed on a periphery of the front surface of the base sheet, on which the transparent conductive film and the light-blocking conductive film have been formed, and the frame-like light-blocking layer being made of a product based on a color resist material that has been exposed and developed; and
   a polarization plate between the cover glass and the film sensor member;
   the base sheet of the film sensor member being a laminated body made of a λ/2 phase difference film and the λ/4 phase difference film adhered to each other, and the λ/2 phase difference film of the laminated body is arranged nearer to the polarization plate.

* * * * *